United States Patent
Müller-Siebert et al.

(10) Patent No.: US 10,046,331 B2
(45) Date of Patent: Aug. 14, 2018

(54) METHOD AND DEVICE FOR FRAGMENTING AND/OR WEAKENING MATERIAL BY MEANS OF HIGH-VOLTAGE PULSES

(75) Inventors: Reinhard Müller-Siebert, Bern (CH); Fabrice Monti Di Sopra, Thun (CH); Harald Giese, Stutensee (DE); Urs Friedli, Bern (CH)

(73) Assignee: selFrag AG, Kerzers (CH)

( * ) Notice: Subject to any disclaimer, the term of this patent is extended or adjusted under 35 U.S.C. 154(b) by 563 days.

(21) Appl. No.: 14/423,618

(22) PCT Filed: Aug. 24, 2012

(86) PCT No.: PCT/CH2012/000203
§ 371 (c)(1),
(2), (4) Date: May 4, 2015

(87) PCT Pub. No.: WO2014/029034
PCT Pub. Date: Feb. 27, 2014

(65) Prior Publication Data
US 2015/0238972 A1    Aug. 27, 2015

(51) Int. Cl.
*B02C 19/18* (2006.01)
*H01J 37/32* (2006.01)

(52) U.S. Cl.
CPC ........ *B02C 19/18* (2013.01); *H01J 37/32559* (2013.01); *B02C 2019/183* (2013.01); *H01J 2237/038* (2013.01)

(58) Field of Classification Search
CPC .............. B02C 19/18; B02C 2019/183; H01J 37/32559; H01J 2237/038

(Continued)

(56) References Cited

U.S. PATENT DOCUMENTS

| 4,313,573 A | 2/1982 | Goldberger et al. |
| 4,540,127 A * | 9/1985 | Andres ................... B02C 19/18 241/1 |

(Continued)

FOREIGN PATENT DOCUMENTS

| JP | H09192526 A | 7/1997 |
| JP | 2003311175 A | 11/2003 |

(Continued)

OTHER PUBLICATIONS

Notification of Reasons for Refusal for Application No. JP 2015-527743, dated Aug. 1, 2016.

(Continued)

*Primary Examiner* — Faye Francis
(74) *Attorney, Agent, or Firm* — Marshall, Gerstein & Borun LLP

(57) ABSTRACT

A method for fragmenting and/or weakening material by high-voltage pulses is provided. The material and a processing fluid are arranged in a processing zone formed between two electrodes such that the entire processing zone is flooded with processing fluid, and high-voltage pulses are applied to the electrodes such that high-voltage breakdowns occur between the two electrodes and/or such that predischarge channels are formed without breakdowns. An electrode with a metallic conductor is chosen for at least one of the two electrodes, the conductor being provided partially or completely with an insulator or insulating coating at the working end of the electrode that is in contact with the processing fluid, the permittivity of the insulator/insulating coating being at least 75% of the permittivity of the processing fluid.

20 Claims, 10 Drawing Sheets

Figure 1:
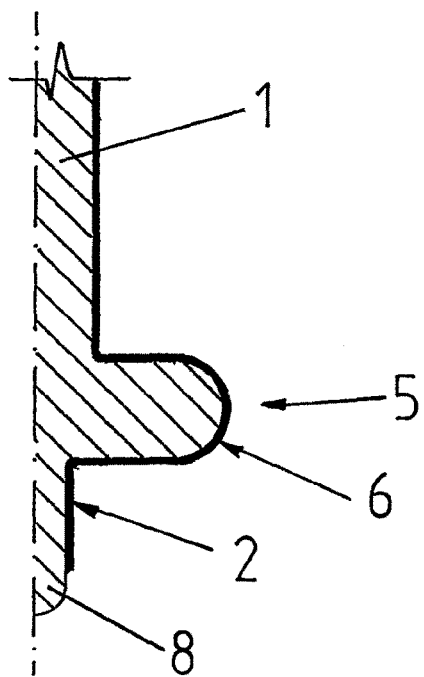

(58) Field of Classification Search
USPC .......................................................... 241/1
See application file for complete search history.

(56) References Cited

U.S. PATENT DOCUMENTS

| | | | | |
|---|---|---|---|---|
| 7,246,761 B2* | 7/2007 | Hoppe | ................... | B02C 19/18 166/248 |
| 7,677,486 B2* | 3/2010 | Hoppe | ................... | B02C 19/18 241/1 |
| 8,125,129 B2* | 2/2012 | Maurer | ................... | B02C 19/18 241/1 |
| 2007/0187539 A1* | 8/2007 | Hoppe | ................... | B02C 19/18 241/301 |
| 2008/0283639 A1* | 11/2008 | Frey | ....................... | B02C 19/18 241/20 |

FOREIGN PATENT DOCUMENTS

| | | |
|---|---|---|
| JP | 2009526636 A | 7/2009 |
| JP | 2010521682 A | 6/2010 |
| WO | WO-8606652 A1 | 11/1986 |
| WO | WO-2007/093063 A1 | 8/2007 |
| WO | WO-2008017172 A1 | 2/2008 |

OTHER PUBLICATIONS

International Search Report in corresponding PCT/CH2012/000203 dated May 22, 2013.

* cited by examiner

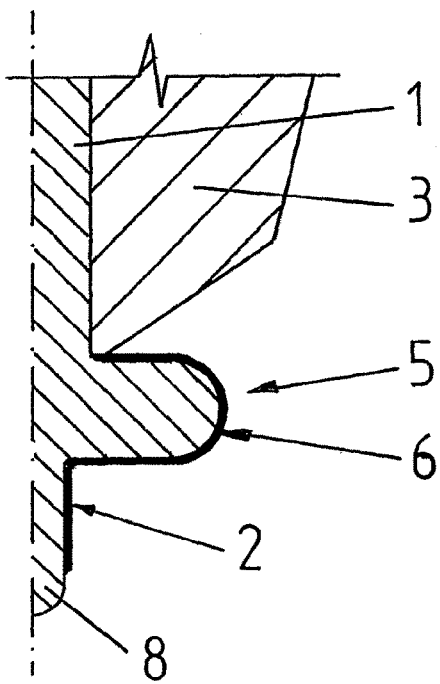
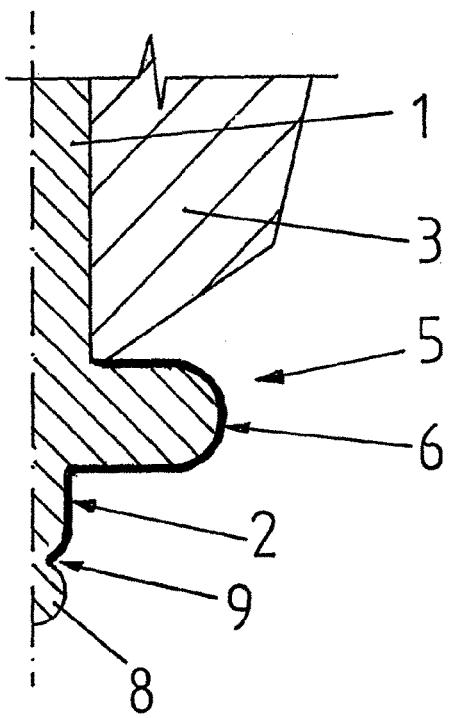

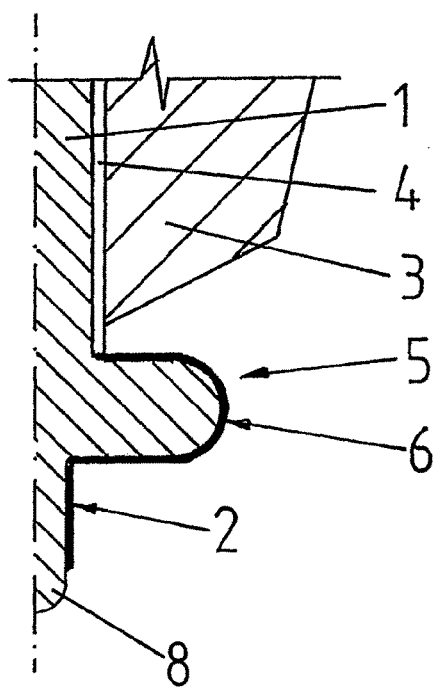
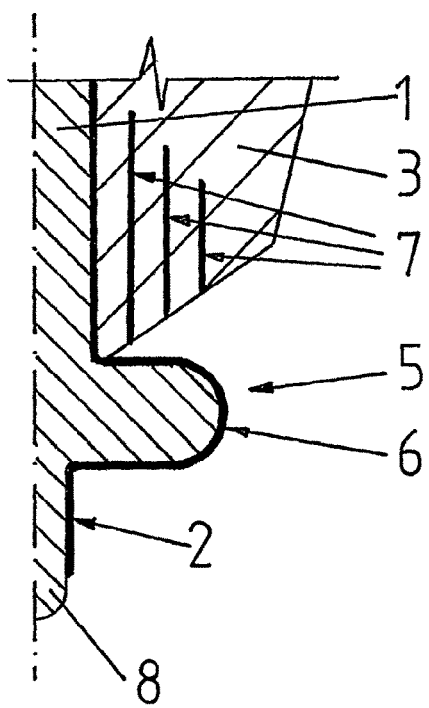

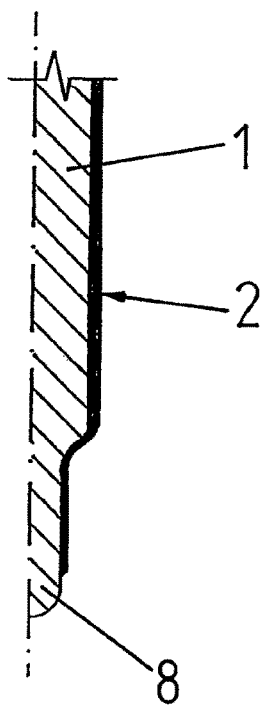
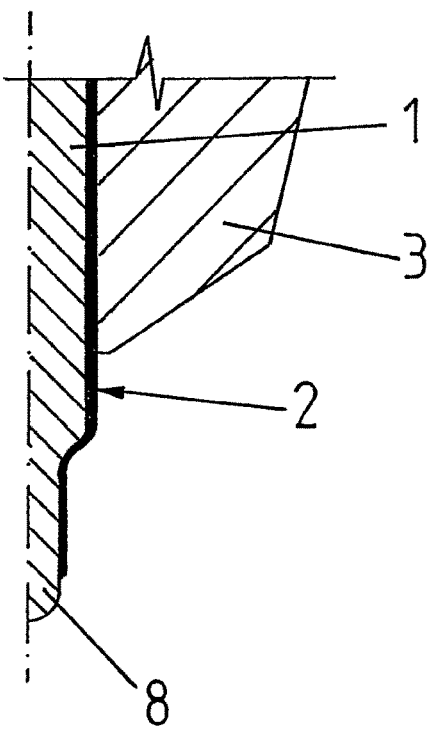

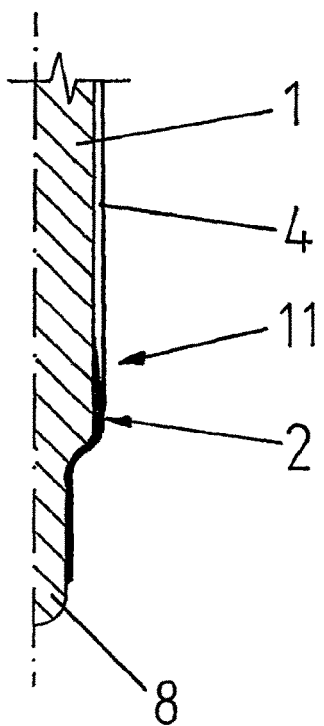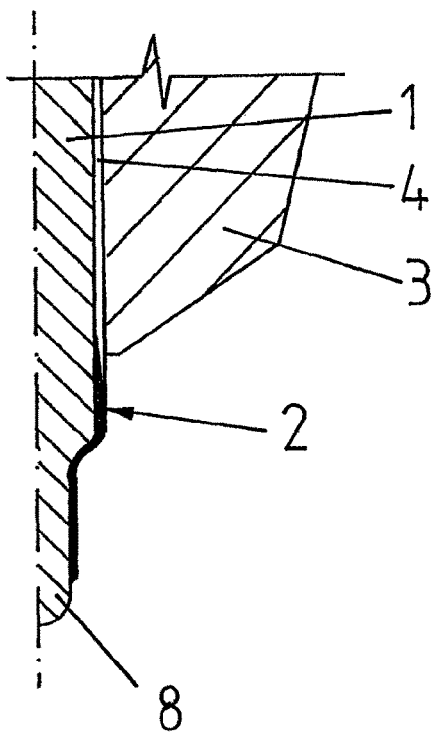

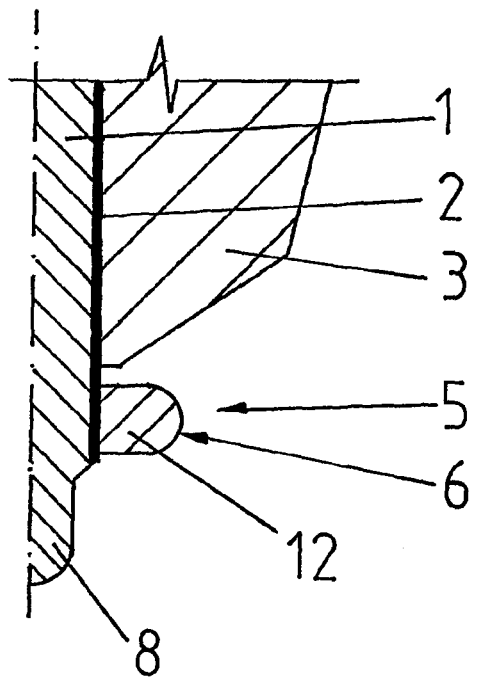
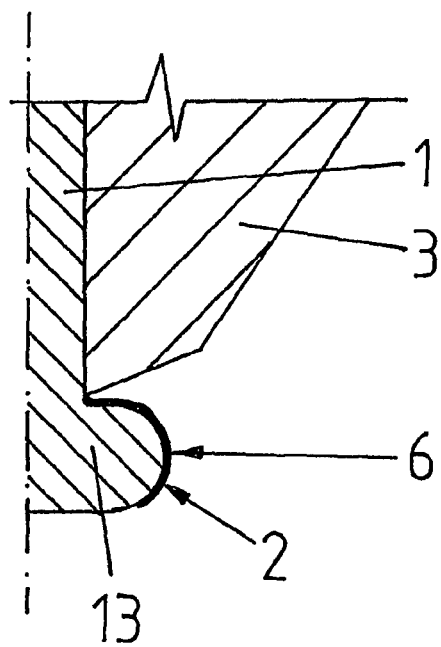

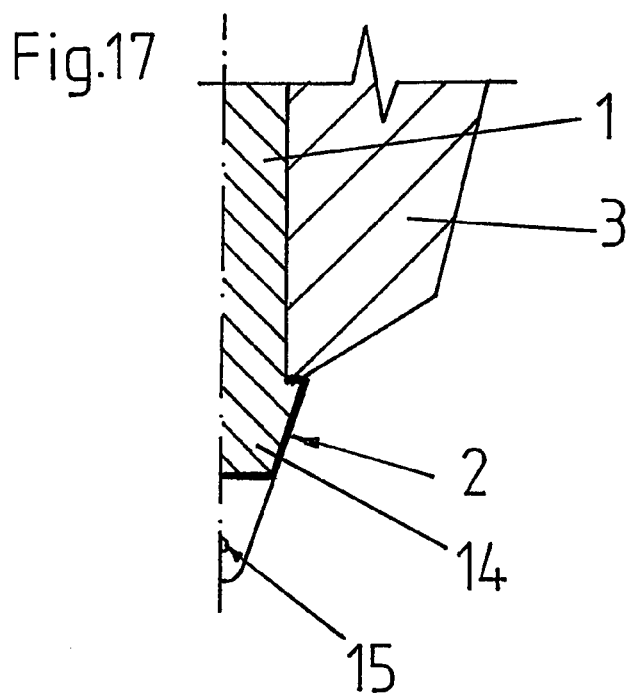

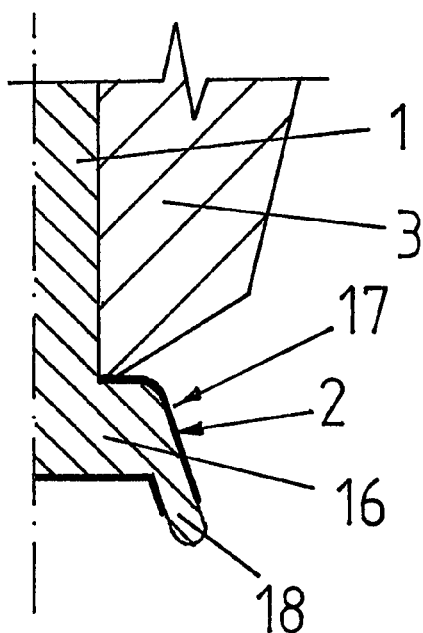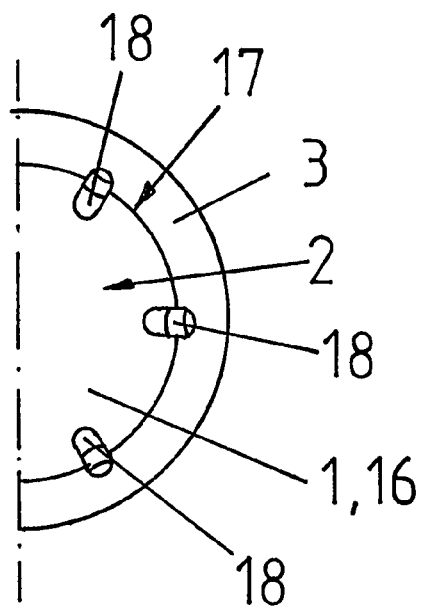

METHOD AND DEVICE FOR FRAGMENTING AND/OR WEAKENING MATERIAL BY MEANS OF HIGH-VOLTAGE PULSES

BACKGROUND

The invention relates to a method for fragmenting and/or weakening material by means of high-voltage pulses, an electrode for using in the method, a device for fragmenting and/or weakening material by means of high-voltage pulses particularly according to the method, as well as the use of the electrode or of the device for fragmenting and/or weakening material according to the preambles of the independent claims.

PRIOR ART

It is known from the prior art how to fragment or weaken a variety of materials, e.g. concrete or rocks, by means of pulsed high-voltage discharges, e.g. to induce cracks in such a way that the materials can be fragmented easier in a subsequent mechanical fragmenting process.

In order to do this, the material to be fragmented or weakened, respectively, is inserted together with a processing fluid, e.g. water, into a zone where high voltage discharges are generated between two electrodes. In order to generate a discharge, the electrodes are supplied with a high-voltage pulse. For this, a limited time interval is required in order for predischarge channels to overcome the processing fluid and the material distances and for a continuous plasma channel to build up, which then leads to a discharge. During this time a current flows between the electrodes via the processing fluid, having a certain electrical conductivity which may rise with longer operating times, such that the voltage between the electrodes continuously decreases as a consequence of the discharge of the energy well providing the energy. The current flowing during this time until the high-voltage breakdown doesn't provide fragmenting or weakening but only heats up the processing fluid. It therefore means a loss which worsens the energetic efficiency of the process. A permanent replacing or a continuous complex recycling of the processing fluid with the aim of maintaining or reducing the electric conductivity also reduces the efficiency of the process. If the voltage decreases below the breakdown voltage already during the formation of the predischarge channels, the predischarge channels don't grow any further and "die" off. A high-voltage breakdown or a continuous plasma channel doesn't occur in this case, and the entire supplied energy is lost for the fragmenting or weakening process, respectively.

In case of certain applications it may be desired to generate only predischarge channels and no high-voltage breakdowns in order to pre-weaken the material in a gentle manner. In this case it is however also desired that an as small as possible part of the supplied energy serves for heating up the processing fluid and an as large as possible part serves for generating the predischarge channels.

DISCLOSURE OF THE INVENTION

It is the objective of the invention to provide methods and devices for fragmenting and/or weakening materials by means of high-voltage pulses, which have an as good as possible energetic efficiency and are tolerant with respect to a conductivity increase of the processing fluid.

This objective is reached by the subject matters of the independent claims.

According to them, a first aspect of the invention relates to a method for fragmenting and/or weakening material, preferably rock material or ore, by means of high-voltage pulses.

Fragmenting means crushing the material. Weakening (also called pre-weakening) means generating internal cracks in the material, thereby simplifying a further, particularly mechanical, crushing of the material.

The material to be fragmented and/or weakened and a processing fluid are arranged in an opened or closed process zone formed between two electrodes, such that the entire process zone is flooded with processing fluid and therefore both electrodes are in contact with the processing fluid and the material to be fragmented or weakened arranged between the electrodes is entirely immersed into the processing fluid. In this state the electrodes are supplied with high-voltage pulses such that high-voltage breakdowns occur between them, or only such that predischarge channels are formed, without breakdowns, e.g. when the latter are not desired.

According to the invention at least one of the two electrodes is an electrode according to the invention, having a metallic conductor arranged at the working extremity of the electrode that is in contact with the processing fluid, the conductor being provided partially or completely with an insulator or insulating coating according to the invention, the permittivity of which amounts to at least 75% of the permittivity of the processing fluid. Preferably, water is used as processing fluid, typically having a permittivity of about 80.

Surprisingly it has been noticed that the use of such an electrode according to the invention makes it possible to significantly improve the energetic efficiency of methods of this kind for fragmenting and/or weakening material by means of high-voltage pulses and additionally a higher tolerance with respect to an increase of the conductivity of the processing fluid can be achieved.

Preferably an electrode according to the invention is used, the first insulation or insulation coating of which has a permittivity above 50, preferably above 80.

It is further preferred that the permittivity of the first insulation or insulation coating is between 60 and 100, particularly between 75 and 85.

Use of electrodes with such first insulations or insulation coatings, respectively, is particularly advantageous in methods using water as processing fluid.

In a preferred embodiment of the method a first electrode according to the invention is used, wherein its metallic conductor at the working extremity of the electrode which is in contact with the processing fluid has, additionally to the first insulation or insulation coating according to the invention, a second insulation or insulation coating having a permittivity smaller than 50% of the permittivity of the processing fluid, particularly a permittivity between 2 and 10. Sections of the electrode which have this second insulation or insulation coating, respectively, are particularly appropriate for mechanically connecting the electrode to a supporting structure.

It is preferred that a first electrode according to the invention is used, in case of which the first insulation or insulation coating, respectively, and the second insulation or insulation coating, respectively, are adjacent, are merged or penetrate one another, such that they form a continuous and preferably closed insulation surface. In this way it is possible to place regions with very high electric fields in those zones of the respective electrode contour, where they are desired for generating predischarge channels and, if necessary, high-voltage breakdowns.

Furthermore it is preferred that the permittivity of the insulation surface formed by the first insulation or insulation coating, respectively, and the second insulation or insulation coating, respectively, decreases in a direction away from the working extremity, such that the insulation surface has the highest permittivity in the area which is closest to the free end of the working extremity, and has the lowest permittivity in the area situated farthest from this free end. It is preferred that the decrease of permittivity is continuous, at least sectionwise. This can e.g. be reached in such a way that the insulations or insulation coatings, respectively, penetrate one another or are merged in a certain area. In this way it is possible to avoid abrupt field changes.

In a further preferred embodiment of the method the process zone is formed between two electrodes arranged one above the other at a distance from one another, such that the material to be fragmented and/or weakened arranged in the process zone lies on the lower electrode. At least as upper electrode preferably is a first electrode according to the invention. Such an electrode arrangement has been found to be particularly advantageous and additionally offers the advantage, when the upper electrode is formed as the first electrode according to the invention, that its first and/or second insulation or insulation coating is only worn to a small extent by the material to be fragmented and/or weakened.

In further preferred embodiments the method is carried out in a closed process zone, preferably inside a closed process container, or in an open process zone. The first variant is particularly appropriate for a batch operation while the second variant is preferred in case of a continuous operation mode. In the second case a conveyor electrode is used as the lower electrode, by means of which the material to be fragmented and/or weakened is guided into the process zone and can be removed from the process zone after having acted upon it.

A second aspect of the invention relates to an electrode for using in the method according to the first aspect of the invention.

The electrode comprises a metallic conductor, e.g. made of copper or stainless steel, having on the working extremity of the electrode, i.e. at the extremity of the electrode, which is in contact with the processing fluid when the electrode is used as intended, partially or entirely a first insulation or insulation coating according to the invention. This first insulation or insulation coating has a permittivity higher than 50, preferably higher than 80.

By using such electrodes according to the invention it is possible to significantly improve the energetic efficiency of methods of this kind for fragmenting and/or weakening material by means of high-voltage pulses and additionally to achieve a higher tolerance with respect to an increase of the conductivity of the processing fluid.

The first insulation or insulation coating according to the invention has a permittivity between 60 and 100, more preferred between 75 and 85. Electrodes with such first insulations or insulation coatings, respectively, are particularly advantageous in methods using water as processing fluid.

In a preferred embodiment of the electrode, its metallic conductor has at the working extremity of the electrode additionally to the first insulation or insulation coating according to the invention a second insulation or insulation coating according to the invention, having a permittivity smaller than 50, particularly a permittivity between 2 and 10. Areas having this second insulation or insulation coating, respectively, are particularly appropriate for mechanically connecting the electrode to a supporting structure.

It is therefore preferred that the first insulation or insulation coating, respectively, and the second insulation or insulation coating, respectively, according to the invention, are adjacent, are merged or penetrate one another, such that they form a continuous, advantageously closed, insulation surface. In this way it is possible to avoid possible discharge zones between the insulations or insulation coatings respectively.

In case of this embodiment it is preferred that the permittivity of the insulation surface formed by the first insulation or insulation coating, respectively, and the second insulation or insulation coating, respectively, decreases in a direction away from the working extremity, such that the insulation surface has the highest permittivity in the area which is closest to the free end of the working extremity, and has the lowest permittivity in the area situated farthest from this free end. It is preferred that the decrease of permittivity is continuous, at least sectionwise. In this way it is possible to avoid abrupt field changes.

In yet a further preferred embodiment of the electrode the metallic conductor forms an annular section with rounded edge at the working extremity. This annular area serves as field relief when the electrode is used as intended.

The annular section may be connected to the metallic conductor in an electrically conducting way, e.g. when it is in one piece with it, or it may be separated from the metallic conductor by the first insulation or insulation coating, respectively, and therefore electrically insulated from it. The function as field relief is insignificantly influenced by this.

Advantageously the annular section has the first insulation or insulation coating, respectively, at least on its surfaces showing away from the working extremity, particularly when it is connected to the metallic conductor in an electrically conducting way. In this way it is possible to significantly diminish the electrically conducting surface of the electrode.

In a variant of the electrode described above the annular section forms the working side extremity of the electrode. In this way a blunt electrode with a large, e.g. plate-shaped, front face is obtained.

In another variant of the electrode a particularly spherical segment-shaped or paraboloid-of-revolution-shaped electrode tip follows the annular section, the electrode tip forming the working extremity of the electrode. Preferably, this electrode tip is metallically blank at its free end. In this way a relatively sharp electrode with a small front face is obtained.

Depending on the field of use of the electrode the one or the other variant is preferred.

In yet another preferred embodiment the electrode has an insulating body made of a material with a permittivity smaller than 20, e.g. PE or PP, out of which the metallic conductor protrudes at the working extremity. According to the claims this insulating body may form a second insulation or may be present in addition to another second insulation or insulation coating. Such electrodes may be attached to a supporting structure in an electrically insulated way by means of the insulating body in a simple way.

In a variant of this embodiment of the electrode, the insulating body is interspersed with one or more annular elements, which are concentric to the metallic conductor penetrating the insulating body and made of a material with a higher permittivity than the material of the isolator, e.g. a metallic material like stainless steel, or a plastic interspersed with graphite. In this way the permittivity distribution, which is averaged in this section with respect to the volume of the insulating body, may be influenced in a targeted way.

Furthermore, in case of the embodiment of the electrode with one insulating body, it is preferred that the metallic conductor has the first or the second insulation or insulation coating, respectively, in the section where it protrudes out of the insulating body. Particularly in case that it has the second insulation or insulation coating at this position, a relatively smooth transition with respect to the electric field strengths from the insulating body to the metallic body is reached.

A third aspect of the invention relates to a device for fragmenting and/or weakening material, particularly rock material or ore, by means of high-voltage pulses. This embodiment is advantageously suitable for carrying out the method according to the first aspect of the invention.

The device comprises two electrodes of which one or both is or are formed according to the second aspect of the invention. A process zone is formed between the two electrodes, in which the material to be fragmented and/or weakened and a processing fluid can be arranged such that the entire process zone is flooded with processing fluid. In this state high-voltage pulses being applied to the electrodes such that high-voltage breakdowns occur between the two electrodes and/or such that predischarge channels are formed without breakdowns.

In a preferred embodiment of the device both electrodes are arranged one above the other in such a way that the material to be fragmented and/or weakened lies on the lower electrode when the process zone is flooded. Advantageously at least the upper electrode is formed according to the second aspect of the invention. Such an arrangement of the electrodes has been found to be particularly advantageous and offers additionally the advantage, when the upper electrode is formed as first electrode according to the claims, that its first and/or second insulation or insulation coating, respectively, is only little stressed by the material to be fragmented and/or weakened.

In further preferred embodiments the device has either a closed or closable, respectively, process zone, which is preferably formed by a closed process container, or an opened process zone. The first variant is particularly suitable for a batch operation mode, while the last variant is preferred in case of a continuous operation. In the last case the lower electrode is preferably formed as a conveyor electrode, by means of which the material to be fragmented and/or weakened is guided into the process zone and may be removed from the process zone after having acted upon it.

SHORT DESCRIPTION OF THE DRAWINGS

Figure 2:
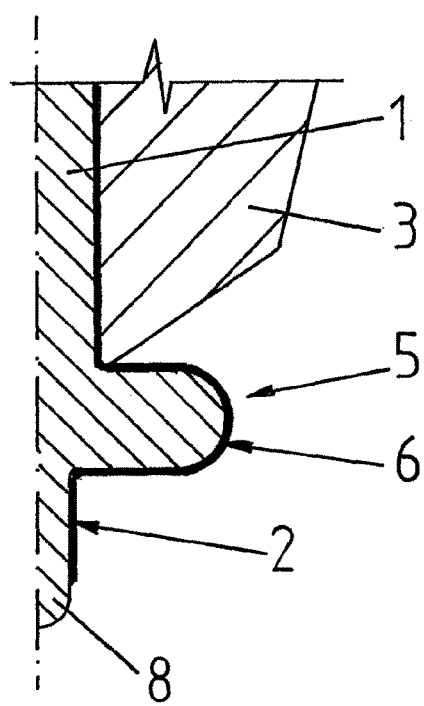
Figure 7:
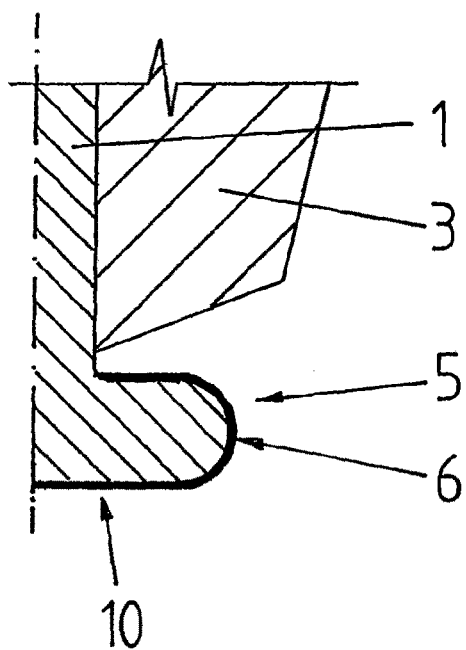
Figure 8:
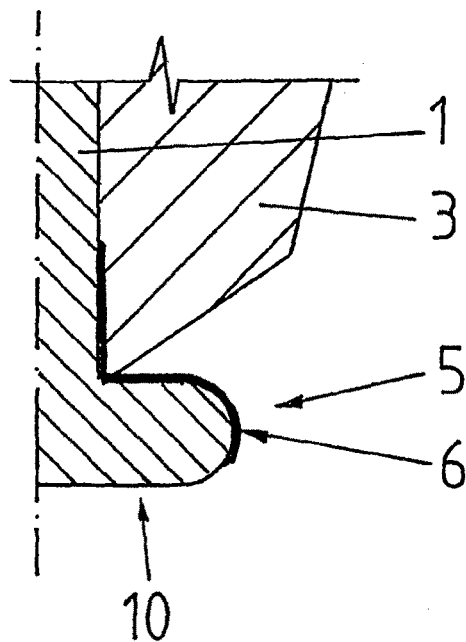
Figure 15:
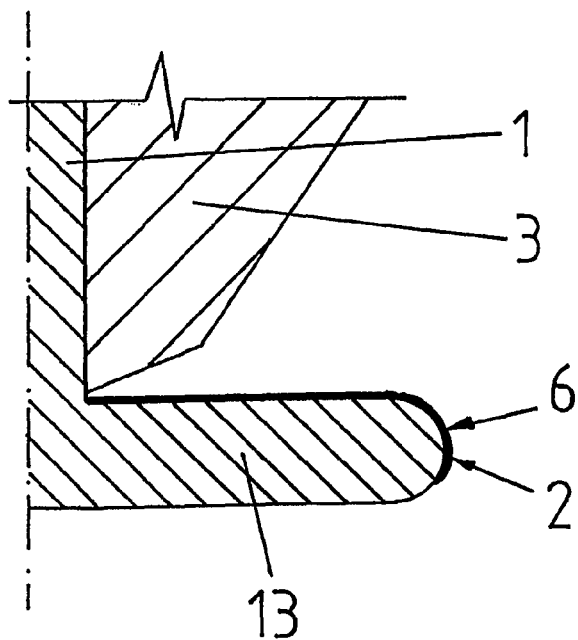
Figure 16:
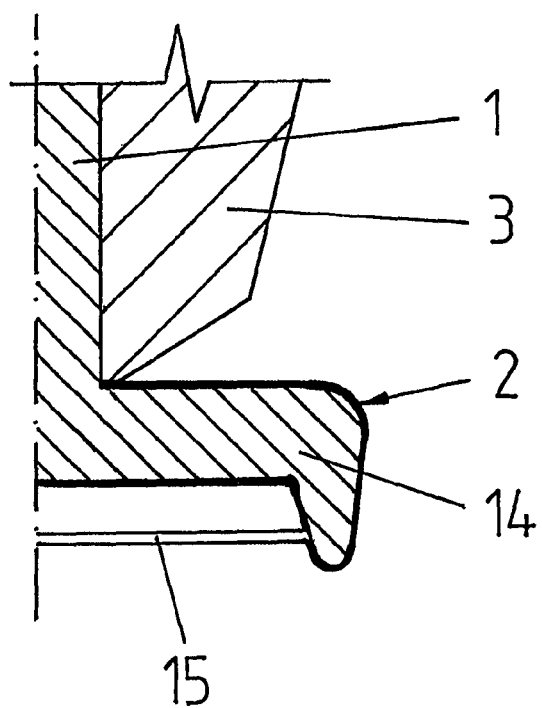

Further embodiments, advantages and applications of the invention result from the dependent claims and from the now following description by means of the figures. Thereby it is shown in:

FIG. 1 a vertical section view through a half of the working extremity of a first electrode according to the invention;

FIG. 2 a vertical section view through a half of the working extremity of a second electrode according to the invention;

FIG. 3 a vertical section view through a half of the working extremity of a third electrode according to the invention;

FIG. 4 a vertical section view through a half of the working extremity of a fourth electrode according to the invention;

FIG. 5 a vertical section view through a half of the working extremity of a fifth electrode according to the invention;

FIG. 6 a vertical section view through a half of the working extremity of a sixth electrode according to the invention;

FIG. 7 a vertical section view through a half of the working extremity of a seventh electrode according to the invention;

FIG. 8 a vertical section view through a half of the working extremity of an eighth electrode according to the invention;

FIG. 9 a vertical section view through a half of the working extremity of a ninth electrode according to the invention;

FIG. 10 a vertical section view through a half of the working extremity of a tenth electrode according to the invention;

FIG. 11 a vertical section view through a half of the working extremity of an eleventh electrode according to the invention;

FIG. 12 a vertical section view through a half of the working extremity of a twelfth electrode according to the invention;

FIG. 13 a vertical section view through a half of the working extremity of a thirteenth electrode according to the invention;

FIG. 14 a vertical section view in transversal direction through a half of the working extremity of a fourteenth electrode according to the invention;

FIG. 15 a vertical section view in longitudinal direction through a half of the working extremity of the electrode according to FIG. 14;

FIG. 16 a vertical section view in longitudinal direction through a half of the working extremity of a fifteenth electrode according to the invention;

FIG. 17 a vertical section view in transversal direction through a half of the working extremity of the electrode according to FIG. 16;

FIG. 18 a vertical section view through a half of the working extremity of a sixteenth electrode according to the invention; and FIG. 19 a view on a half of the working extremity of the electrode according to FIG. 18;

WAYS OF CARRYING OUT THE INVENTION

FIG. 1 shows a vertical section view through a half of the working extremity of a first, rotation symmetric electrode according to the invention. As can be seen, the electrode has a substantially bar-shaped metallic conductor 1, e.g. made of copper or stainless steel, which forms an annular section 5 with rounded edge 6 at the shown working extremity of the electrode, and, following the annular section 5 towards the free end of the electrode, a spherical segment-shaped electrode tip 8 which represents the working extremity of the electrode. Except for the actual electrode tip 8, the metallic conductor 1 has a first insulation coating 2 according to the invention, e.g. made of $TiO_2$, having a permittivity which is higher than 50. The annular section 5 serves as field relief.

FIG. 2 shows a vertical section view through a half of the working extremity of a second electrode according to the invention, which differs from the one of FIG. 1 only in that the metallic conductor 1 protrudes out of an insulating body 3 with a permittivity smaller than 20, e.g. made of PE or PP.

FIG. 3 shows a vertical section view through a half of the working extremity of a third electrode according to the invention which differs from the electrode of FIG. 2 only in that the metallic conductor 1 doesn't have an insulation coating in the section where it is surrounded by the insulating body 3.

FIG. 4 shows a vertical section view through a half of the working extremity of a fourth electrode according to the invention which differs from the one of FIG. 3 only in that the electrode tip 8 has a recess 9 in which the insulation coating 2 ends.

FIG. 5 shows a vertical section view through a half of the working extremity of a fifth electrode according to the invention which differs from the one of FIG. 2 only in that the metallic conductor 1 has a second insulation coating 4 according to the invention, e.g. made of PE, having a permittivity smaller than 50, in the section following the annular section 5 on the side which is opposed to the working extremity.

FIG. 6 shows a vertical section view through a half of the working extremity of a sixth electrode according to the invention which differs from the one of FIG. 2 only in that the insulating body 3 is interspersed with a plurality of annular elements 7 which are concentric with respect to the metallic conductor 1 penetrating it, made of a material with a higher permittivity than the material of the isolator 3, e.g. made of stainless steel or of a plastic interspersed with graphite.

FIG. 7 shows a vertical section view through a half of the working extremity of a seventh electrode according to the invention which differs from the ones of FIGS. 3 and 4 only in that no electrode tip forming the working extremity of the electrode follows the annular section 5 and in that its front face 10 is entirely covered by the insulation coating 2.

FIG. 8 shows a vertical section view through a half of the working extremity of an eighth electrode according to the invention which differs from the one of FIG. 7 only in that the front face 10 is metallically blank and the insulation coating 2 extends a little into the insulating body 3.

FIG. 9 shows a vertical section view through a half of the working extremity of a ninth electrode according to the invention which differs from the one of FIG. 1 only in that it doesn't have the annular section present in FIG. 1.

FIG. 10 shows a vertical section view through a half of the working extremity of a tenth electrode according to the invention which differs from the one of FIG. 9 only in that the metallic conductor 1 protrudes out of an insulating body 3 made of a material with a permittivity smaller than 20, e.g. PE or PP.

FIG. 11 shows a vertical section view through a half of the working extremity of an eleventh electrode according to the invention which differs from the one of FIG. 9 only in that the metallic conductor 1 has the first insulation coating 2 according to the invention only in the section of the electrode tip 8, wherein the electrode tip 8 itself is metallically blank, and has in the other sections a second insulation coating 4 according to the invention, e.g. made of PE, with a permittivity smaller than 50. The two insulation coatings 2, 4 penetrate one another in a transitional area 11.

FIG. 12 shows a vertical section view through a half of the working extremity of a twelfth electrode according to the invention which differs from the one of FIG. 11 only in that the metallic conductor 1 protrudes out of an insulating body 3 made of a material with a permittivity smaller than 20, e.g. PE or PP.

FIG. 13 shows a vertical section view through a half of the working extremity of a thirteenth electrode according to the invention which differs from the one of FIG. 10 only in that the metallic conductor 1 carries an annular bead 5 with rounded edge 6 between the electrode tip 8 and the insulation body 3, made of the same metal like the metallic conductor 1 or of another metallic material which serves as field relief and which is separated from the metallic conductor 1 by the first insulation coating 2 according to the invention and is electrically insulated with respect to the metallic conductor. A further difference to the electrode of FIG. 10 is that the electrode tip 8 is entirely metallically blank. The metallic conductor 1 of such an electrode may be manufactured in a cost efficient way of a round metal bar having the first insulation coating according to the invention, by removing its end for making the blank electrode tip 8 and by shrinking a component 12 forming the annular bead 5 onto the coated metal bar in the section following the electrode tip 8.

FIGS. 14 and 15 show vertical section views in transversal direction (FIG. 14) and in longitudinal direction (FIG. 15) through a half of the working extremity of a fourteenth electrode according to the invention and differ from the one of FIG. 7 only in that it has a bar-shaped electrode head 13 with rounded edge 6 instead of the round plate-shaped electrode head of the electrode shown in FIG. 7.

FIGS. 16 and 17 show a vertical section views in transversal direction (FIG. 17) and in longitudinal direction (FIG. 16) through a half of the working extremity of a fifteenth electrode according to the invention and differ from the ones of FIGS. 14 and 15 only in that it has a yoke-shaped electrode head 14 entirely covered with an insulation coating 2 according to the invention and between which a blank electrode wire 15 is spanned, instead of the bar-shaped electrode head.

FIG. 18 shows a vertical section view through a half of the working extremity of a sixteenth electrode according to the invention which differs from the one of FIG. 7 only in that it has a round and plate-shaped electrode head 16 with an edge 17 forming a truncated cone contour instead of the round plate-shaped electrode head of FIG. 7, wherein six finger-shaped electrode tips 18 protrude downwards, being slightly inclined towards the exterior and arranged on the bottom side of the electrode head 16 in the edge region and distributed evenly over the circumference of the same. The electrode tips 18 have spherical segment-shaped front faces. The entire electrode head 16 has a first insulation coating 2 according to the invention except on the front faces.

FIG. 19 shows a view on a half of the working extremity of the electrode according to FIG. 18.

While preferred embodiments of the invention are described in the present patent application, it is clearly noted that the invention is not limited to these embodiments but can also be carried out in different ways within the scope of the following claims.

The invention claimed is:

1. A method for fragmenting or weakening material, the method comprising:
    providing two electrodes, wherein at least a first of the two electrodes includes a metallic conductor that is provided partially or completely with an insulation at a working extremity of the electrode,
    forming a process zone between the two electrodes,
    arranging material to be fragmented or weakened and a processing fluid in the process zone, such that the entire process zone is flooded with the processing fluid and the insulation at the working end of the electrode is in contact with the processing fluid, and applying high-voltage pulses to the two electrodes such that at least one of high-voltage breakdowns occur between the two electrodes or predischarge channels are formed without breakdowns, wherein a permittivity of the insulation is at least 75% of a permittivity of the processing fluid.

2. The method according to claim 1, wherein the insulation has a permittivity above 50.

3. The method according to claim 2, wherein the insulation has a permittivity between 60 and 100.

4. The method according to claim 1, wherein the insulation comprises a first insulation, and providing the first electrode includes providing the first electrode partially with a second insulation at the working extremity, the second insulation having a permittivity smaller than 50% of the permittivity of the processing fluid.

5. The method according to claim 4, wherein providing the first electrode includes providing the first insulation and the second insulation adjacent to one another, merged together, or penetrating one another, such that the first insulation and the second insulation form a continuous insulation surface.

6. The method according to claim 5, wherein the permittivity of the insulation surface formed by the first insulation and the second insulation decreases in a direction away from the working extremity.

7. The method according to claim 6, wherein the permittivity of the continuous insulation surface formed by the first insulation and the second insulation in a direction away from the working extremity decreases continuously at least sectionwise.

8. The method according to claim 4, wherein the second insulation is a second insulating coating.

9. The method according to claim 4, wherein the second insulation has a permittivity between 2 and 10.

10. The method according to claim 1, wherein forming the process zone comprises forming the process zone between the two electrodes arranged one above the other at a distance from one another, and arranging the material to be fragmented or weakened comprises arranging the material to be fragmented or weakened in the process zone on a lower electrode, wherein the first electrode is used as an upper electrode.

11. The method according to claim 10, wherein forming the process zone comprises forming an open process zone, wherein a conveyor electrode is used as the lower electrode.

12. The method according to claim 1, wherein forming the process zone comprises forming a closed process zone.

13. The method according to claim 1, wherein the insulation is an insulating coating.

14. The method according to claim 1, wherein the material to be fragmented or weakened comprises a rock material or ore.

15. The method according to claim 1, wherein the processing fluid is water.

16. A device for fragmenting weakening material by high-voltage pulses, the device comprising two electrodes of which at least one comprises a metallic conductor having on a working extremity of the electrode, which is in contact with a processing fluid, partially or entirely an insulation, having a permittivity higher than 50, wherein a process zone is formed between the two electrodes, in which material to be fragmented or weakened and the processing fluid can be arranged such that the entire process zone is flooded with the processing fluid, and wherein high-voltage pulses are applied to the electrodes such that at least one of: high-voltage breakdowns occur between the two electrodes or predischarge channels are formed without breakdowns.

17. The device according to claim 16, wherein each of the two electrodes comprises a metallic conductor having on a working extremity of the electrode partially or entirely a insulation, having a permittivity higher than 50.

18. The device according to claim 16, wherein the two electrodes are arranged one above the other in such a way that the material to be fragmented or weakened lies on a lower electrode of the two electrodes when the process zone is flooded, and wherein at least an upper electrode of the two electrodes is formed comprising a metallic conductor having on a working extremity of the electrode, which is in contact with the processing fluid, partially or entirely an insulation having a permittivity higher than 50.

19. The device according to claim 16, wherein the process zone is formed in a closed container.

20. The device according to claim 16, wherein the process zone comprises an opened process zone and wherein both electrodes are arranged above one another and a lower electrode of the two electrodes comprises a conveyor electrode.

* * * * *